(12) United States Patent
Maki et al.

(10) Patent No.: US 10,396,810 B2
(45) Date of Patent: Aug. 27, 2019

(54) QUANTUM INTERFERENCE DEVICE, ATOMIC OSCILLATOR, ELECTRONIC APPARATUS, AND MOVING OBJECT

(71) Applicant: Seiko Epson Corporation, Tokyo (JP)

(72) Inventors: Yoshiyuki Maki, Suwa (JP); Nobuhito Hayashi, Chino (JP)

(73) Assignee: Seiko Epson Corporation (JP)

( * ) Notice: Subject to any disclaimer, the term of this patent is extended or adjusted under 35 U.S.C. 154(b) by 154 days.

(21) Appl. No.: 15/465,931

(22) Filed: Mar. 22, 2017

(65) Prior Publication Data

US 2017/0288688 A1    Oct. 5, 2017

(30) Foreign Application Priority Data

Mar. 29, 2016 (JP) ................. 2016-065213

(51) Int. Cl.
| | | |
|---|---|---|
| G04F 5/14 | (2006.01) | |
| H03B 17/00 | (2006.01) | |
| H03L 1/04 | (2006.01) | |
| H03L 7/26 | (2006.01) | |
| H01S 5/00 | (2006.01) | |
| H01S 5/183 | (2006.01) | |
| H01S 5/022 | (2006.01) | |
| H01S 5/0687 | (2006.01) | |

(52) U.S. Cl.
CPC ................. *H03L 7/26* (2013.01); *G04F 5/14* (2013.01); *H01S 5/005* (2013.01); *H01S 5/183* (2013.01); *H03B 17/00* (2013.01); *H03L 1/04* (2013.01); *H01S 5/02212* (2013.01); *H01S 5/02248* (2013.01); *H01S 5/0687* (2013.01)

(58) Field of Classification Search
CPC .......... G04F 5/14; G04F 5/145; H03B 17/00; H03L 1/04; H03L 7/26
USPC ....................... 331/3, 68, 69, 94.1
See application file for complete search history.

(56) References Cited

U.S. PATENT DOCUMENTS

| | | |
|---|---|---|
| 6,888,871 B1 | 5/2005 | Zhang et al. |
| 7,215,213 B2 | 5/2007 | Mescher et al. |
| 8,067,991 B2 | 11/2011 | Youngner et al. |
| 8,218,590 B2 | 7/2012 | Youngner et al. |
| 8,242,851 B2 | 8/2012 | Youngner et al. |
| 8,299,860 B2 | 10/2012 | Youngner et al. |
| 8,941,442 B2 | 1/2015 | Youngner et al. |

(Continued)

FOREIGN PATENT DOCUMENTS

| | | |
|---|---|---|
| JP | 2004-503118 A | 1/2004 |
| JP | 4972550 B2 | 7/2012 |

(Continued)

*Primary Examiner* — Levi Gannon
(74) *Attorney, Agent, or Firm* — Harness, Dickey & Pierce, P.L.C.

(57) ABSTRACT

A quantum interference device includes an atomic cell, a light source, a light detector, a package, and a reflective portion. The atomic cell has alkali metal atoms disposed within, and the light source emits light to excite the alkali metal atoms in the atomic cell. The light detector detects light transmitted through the atomic cell. The package defines an internal space and houses at least the light source. The reflective portion is provided between an inner surface of the package and the light source, and has reflectance to an electromagnetic wave having a wavelength of 4 μm, where the reflectance is greater than or equal to 50%.

8 Claims, 10 Drawing Sheets

(56) References Cited

U.S. PATENT DOCUMENTS

| | | |
|---|---|---|
| 9,146,540 B2 | 9/2015 | Youngner et al. |
| 9,356,426 B2 | 5/2016 | Chindo |
| 2005/0025211 A1 | 2/2005 | Zhang et al. |
| 2005/0046851 A1* | 3/2005 | Riley, Jr. ............... G01N 21/031 356/437 |
| 2007/0139128 A1* | 6/2007 | Koyama ................. G04F 5/145 331/94.1 |
| 2007/0146085 A1* | 6/2007 | Koyama ................. G04F 5/145 331/94.1 |
| 2008/0267232 A1* | 10/2008 | DeNatale ............... G01S 19/02 372/27 |
| 2009/0128820 A1* | 5/2009 | Nomura ................. G04F 5/145 356/437 |
| 2009/0315629 A1* | 12/2009 | Chindo .................. G04F 5/145 331/94.1 |
| 2010/0102893 A1* | 4/2010 | Chindo .................... H03L 7/26 331/94.1 |
| 2011/0187464 A1 | 8/2011 | Youngner et al. |
| 2012/0212298 A1* | 8/2012 | Lecomte ................... G04F 5/14 331/94.1 |
| 2014/0293551 A1* | 10/2014 | Chindo ................. H01S 5/0687 361/728 |
| 2015/0102863 A1* | 4/2015 | Hashi ....................... H03L 7/26 331/94.1 |
| 2015/0180199 A1 | 6/2015 | Shibata et al. |
| 2015/0214895 A1* | 7/2015 | Hashi ....................... G04F 5/14 331/94.1 |

FOREIGN PATENT DOCUMENTS

| | | |
|---|---|---|
| JP | 2014-192705 A | 10/2014 |
| JP | 2015-070474 A | 4/2015 |
| JP | 2015-119152 A | 6/2015 |
| JP | 5785380 B2 | 9/2015 |
| WO | WO-02-05397 A2 | 1/2002 |
| WO | WO-2006-017345 A | 10/2014 |

* cited by examiner

QUANTUM INTERFERENCE DEVICE, ATOMIC OSCILLATOR, ELECTRONIC APPARATUS, AND MOVING OBJECT

CROSS-REFERENCE TO RELATED APPLICATIONS

The entire disclosure of Japanese Patent Application No. 2016-065213 filed Mar. 29, 2016 is expressly incorporated by reference herein.

BACKGROUND

1. Technical Field

The present disclosure relates to a quantum interference device, an atomic oscillator, an electronic apparatus, and a moving object.

2. Related Art

Hitherto, an oscillator which oscillates based on energy transition of atoms of alkali metal, such as rubidium or cesium is known.

As such an oscillator, Japanese Patent No. 5785380 discloses an atomic timepiece provided with a vertical cavity surface emitting laser (VCSEL), a cell, a photodetector, and a package housing these units. The atomic timepiece of Japanese Patent No. 5785380 has a heater block providing thermal energy to the VCSEL and a isothermal cage surrounding the VCSEL in order to maintain the temperature of the VCSEL constant.

Japanese Patent No. 4972550 discloses an atomic timepiece system provided with a device having a VCSEL, a cell, a photodiode, and a heating element, a bridge frame surrounding the device, and a tether connecting the device and the bridge frame. In the atomic timepiece system of Japanese Patent No. 4972550, in order to achieve reduction of change in temperature of the VCSEL due to thermal conduction, the tether is formed of a material having low thermal conductivity. Furthermore, in the atomic timepiece system of Japanese Patent No. 4972550, in order to minimize heat loss due to thermal conduction or convection, the device, the bridge frame, and the tether are housed inside a vacuum device.

However, in the atomic timepiece of Japanese Patent No. 5785380 and the atomic timepiece system of Japanese Patent No. 4972550, while reduction of change in temperature of the VCSEL due to thermal conduction or convection is achieved, measures relating to change in temperature of the VCSEL due to radiation are not sufficiently taken. For this reason, in such an oscillator of the related art, there is a problem in that it is not possible to suppress fluctuation of the wavelength of laser light caused by change in temperature of the VCSEL.

SUMMARY

An advantage of some aspects of the present disclosure is that it provides a quantum interference device and an atomic oscillator capable of suppressing change in temperature of a light source and suppressing fluctuation of the wavelength of light emitted from the light source, and an electronic apparatus and a moving object provided with the quantum interference device having excellent reliability.

The advantage can be achieved by the following configurations.

A quantum interference device according to an aspect of the present disclosure includes an atomic cell which is filled with alkali metal atoms, a light source which emits light for exciting the alkali metal atoms in the atomic cell, a light detector (i.e., a light detection unit) which detects the light transmitted through the atomic cell, a package which has an internal space housing at least the light source, and a reflective portion which is provided between an inner surface of the package and the light source and has reflectance to an electromagnetic wave having a wavelength of 4 μm, where the reflectance is greater than or equal to 50%.

According to this quantum interference device, it is possible to suppress transmission of heat due to radiation between the package and the light source. For this reason, it is possible to suppress change in temperature of the light source, and as a result, to suppress fluctuation of the wavelength of light emitted from the light source.

In the quantum interference device according to the aspect of the present disclosure, the reflective portion is provided on an outer surface of the light source.

With this configuration, it is possible to effectively reduce transmission of radiant heat from the light source to the package.

In the quantum interference device according to the aspect of the present disclosure, the reflective portion is provided on the inner surface of the package.

With this configuration, it is possible to efficiently reflect radiant heat of the light source with the reflective portion, and to reduce escape of heat of the light source to the package. For this reason, it is possible to effectively suppress change in temperature of the light source.

In the quantum interference device according to the aspect of the present disclosure, the reflective portion is provided on a side of the light source from which the light is emitted.

With this configuration, since a portion of the light source where light is emitted is particularly likely to be affected by change in temperature, it is possible to more remarkably exhibit an effect to suppress change in temperature of the light source, and as a result, to more effectively suppress fluctuation of the wavelength of light.

The quantum interference device according to the aspect of the present disclosure may further include a support portion which supports the light source, and the reflective portion is provided on the light source side with respect to the support portion.

With this configuration, it is possible to effectively reduce transmission of heat due to radiation between the package and the light source.

In the quantum interference device according to the aspect of the present disclosure, the internal space is reduced in pressure lower than atmospheric pressure.

With this configuration, it is possible to reduce change in temperature of the light source due to convection in the internal space.

The quantum interference device according to the aspect of the present disclosure may further include a support member which collectively supports the atomic cell and the light source with respect to the package, and the thermal conductivity of the support member is equal to or greater than 0.1 $W \cdot m^{-1} \cdot K^{-1}$ and equal to or less than 40.0 $W \cdot m^{-1} \cdot K^{-1}$.

With this configuration, it is possible to suppress thermal conduction through the support member between the light source and the package, and therefore, to further reduce change in temperature of the light source.

An atomic oscillator according to another aspect of the present disclosure includes the quantum interference device according to the aspect of the present disclosure.

With this configuration, it is possible to provide an atomic oscillator capable of suppressing change in temperature of the light source and suppressing fluctuation of the wavelength of light emitted from the light source.

An electronic apparatus according to still another aspect of the present disclosure includes the quantum interference device according to the aspect of the present disclosure.

With this configuration, it is possible to provide an electronic apparatus having high reliability.

A moving object according to still another aspect of the present disclosure includes the quantum interference device according to the aspect of the present disclosure.

With this configuration, it is possible to provide a moving object having high reliability.

BRIEF DESCRIPTION OF THE DRAWINGS

The present disclosure will be described with reference to the accompanying drawings, wherein like numbers reference like elements.

DESCRIPTION OF EXEMPLARY EMBODIMENTS

Hereinafter, a quantum interference device, an atomic oscillator, an electronic apparatus, and a moving object according to an embodiment of the present disclosure will be described in detail based on exemplary embodiments shown in the accompanying drawings.

1. Atomic Oscillator

First, an atomic oscillator which is provided with a quantum interference device according to an embodiment of the present disclosure will be described. While an example implementation of the quantum interference device of the present disclosure is described with respect to the atomic oscillator, the quantum interference device is not limited, and may be applied to, for example, a magnetic sensor, a quantum memory, or the like, in addition to the atomic oscillator.

First Embodiment

Figure 1:
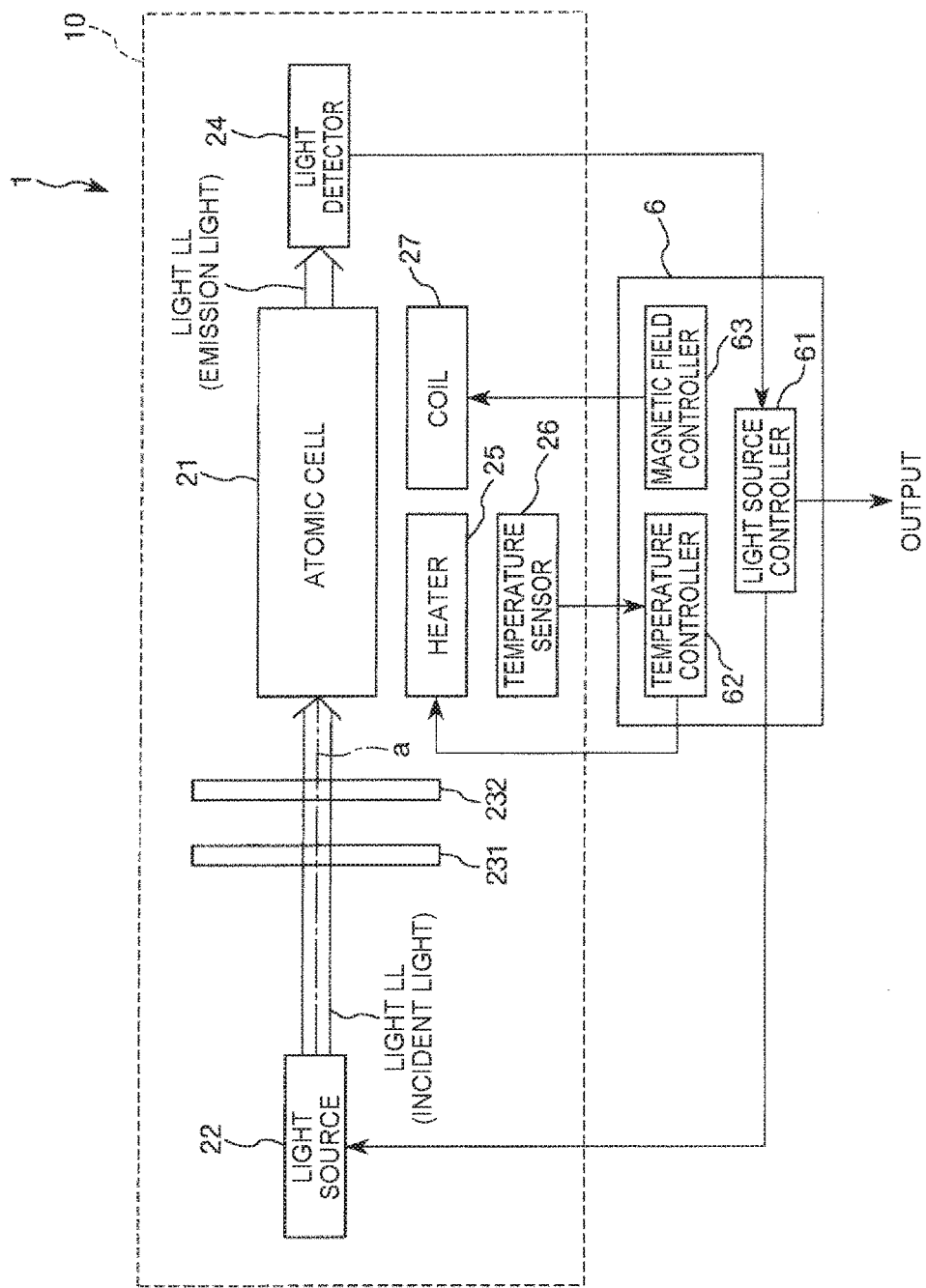
FIG. 1 is a schematic diagram of an atomic oscillator provided with a quantum interference device according to a first embodiment of the present disclosure.

FIG. 1 is a schematic diagram of an atomic oscillator provided with a quantum interference device according to a first embodiment of the present disclosure.

An atomic oscillator 1 shown in FIG. 1 is an atomic oscillator using a coherent population trapping (CPT) phenomenon in which, when alkali metal atoms are irradiated with two types of resonant light having different specific wavelengths, the two types of resonant light pass through alkali metal without being absorbed therein. The coherent population trapping phenomenon is also referred to as electromagnetically induced transparency (EIT) phenomenon.

As shown in FIG. 1, the atomic oscillator 1 has a package unit 10 which causes coherent population trapping, and a controller 6 (a control unit 6) which controls the package unit 10. The package unit 10 has an atomic cell 21, a light source 22, optical components 231 and 232, a light detector 24 (a light detection unit 24), a heater 25, a temperature sensor 26, and a coil 27. The control unit 6 has a light source controller 61 (a light source control unit 61), a temperature controller 62 (a temperature control unit 62), and a magnetic field controller 63 (a magnetic field control unit 63). First, the outline of the atomic oscillator 1 will be described below.

In the atomic oscillator 1, the light source 22 irradiates atomic cell 21 with light LL along an optical axis ("a" in figures) through the optical components 231 and 232, and the light detection unit 24 detects the light LL transmitted through the atomic cell 21.

The atomic cell 21 has light transmissivity, and the atomic cell 21 is filled with alkali metal (metal atoms). The alkali metal has energy levels of a three-level system having two ground levels different from each other and an excitation level. The alkali metal in the atomic cell 21 is heated by the heater 25 and is in a gas stage. The alkali metal in the atomic cell 21 is Zeeman-split by applying a magnetic field in a desired direction from the coil 27.

The light LL emitted from the light source 22 includes two types of light having different frequencies. When the two types of light become a resonant light pair in which the frequency difference matches a frequency corresponding to the energy difference between the two ground levels of the alkali metal in the atomic cell 21, the EIT phenomenon is caused.

The light source control unit 61 controls the frequencies of the two types of light included in the light LL emitted from the above-described light source 22 based on the detection result of the light detection unit 24 such that the EIT phenomenon is caused. The light source control unit 61 is provided with a voltage controlled crystal oscillator (not shown) whose oscillation frequency is controlled according to the detection result of the light detection unit 24. An output signal of the voltage controlled crystal oscillator (VCXO) is output as a clock signal of the atomic oscillator 1.

The temperature control unit 62 controls electrical conduction to the heater 25 based on the detection result of the temperature sensor 26 detecting the temperature of the atomic cell 21 such that the inside of the atomic cell 21 becomes a desired temperature. The magnetic field control unit 63 controls electrical conduction to the coil 27 such that the magnetic field generated by the coil 27 becomes uniform.

The control unit 6 is provided in, for example, an IC chip mounted on a substrate, on which the package unit 10 is mounted. It should be noted that the control unit 6 may be provided in the package unit 10.

The outline of the atomic oscillator 1 has been described above. Hereinafter, the package unit 10 will be described in detail.

Hereinafter, the configuration of each unit of the atomic oscillator 1 of this embodiment will be described.

Figure 2:
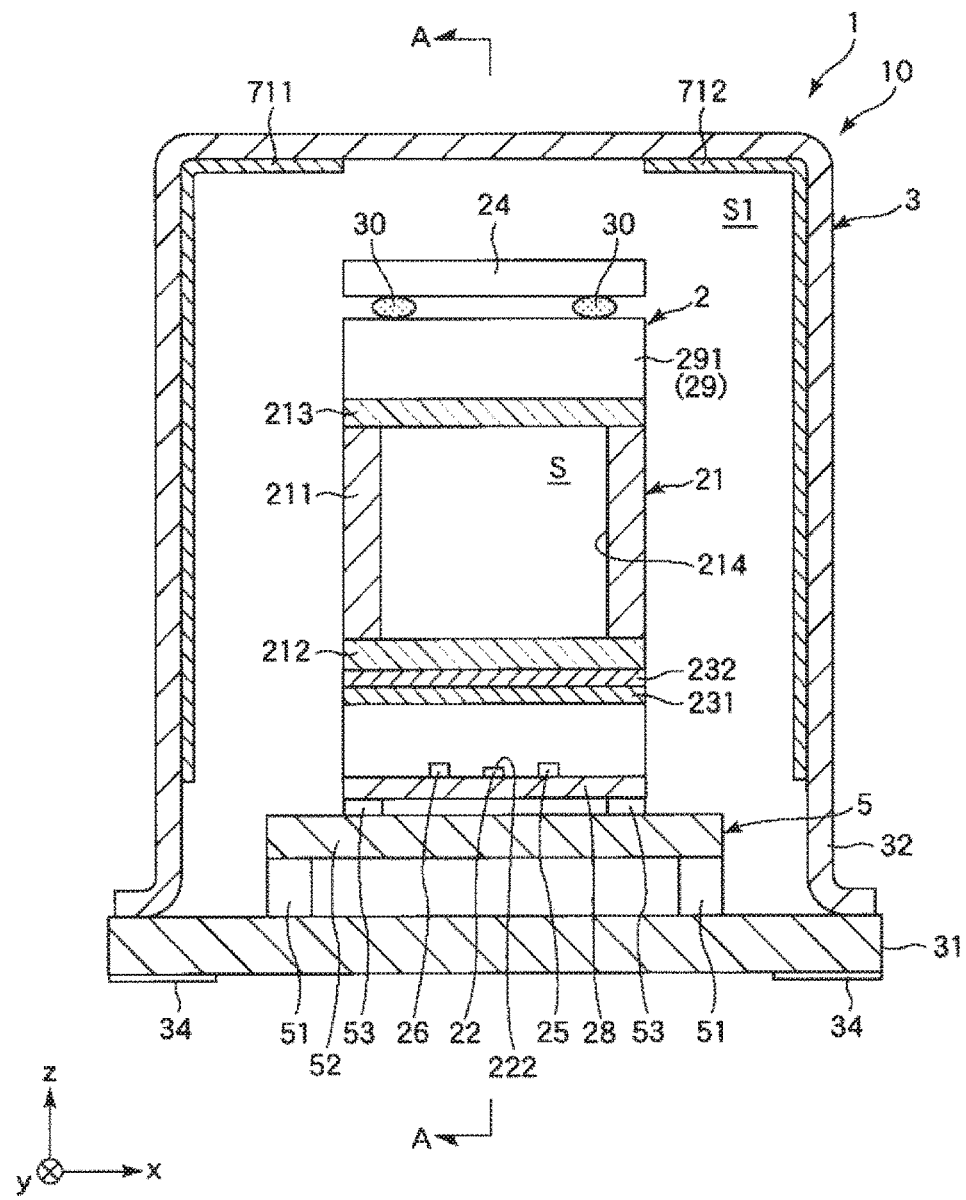
FIG. 2 is a schematic of a sectional view of the atomic oscillator.
Figure 3:
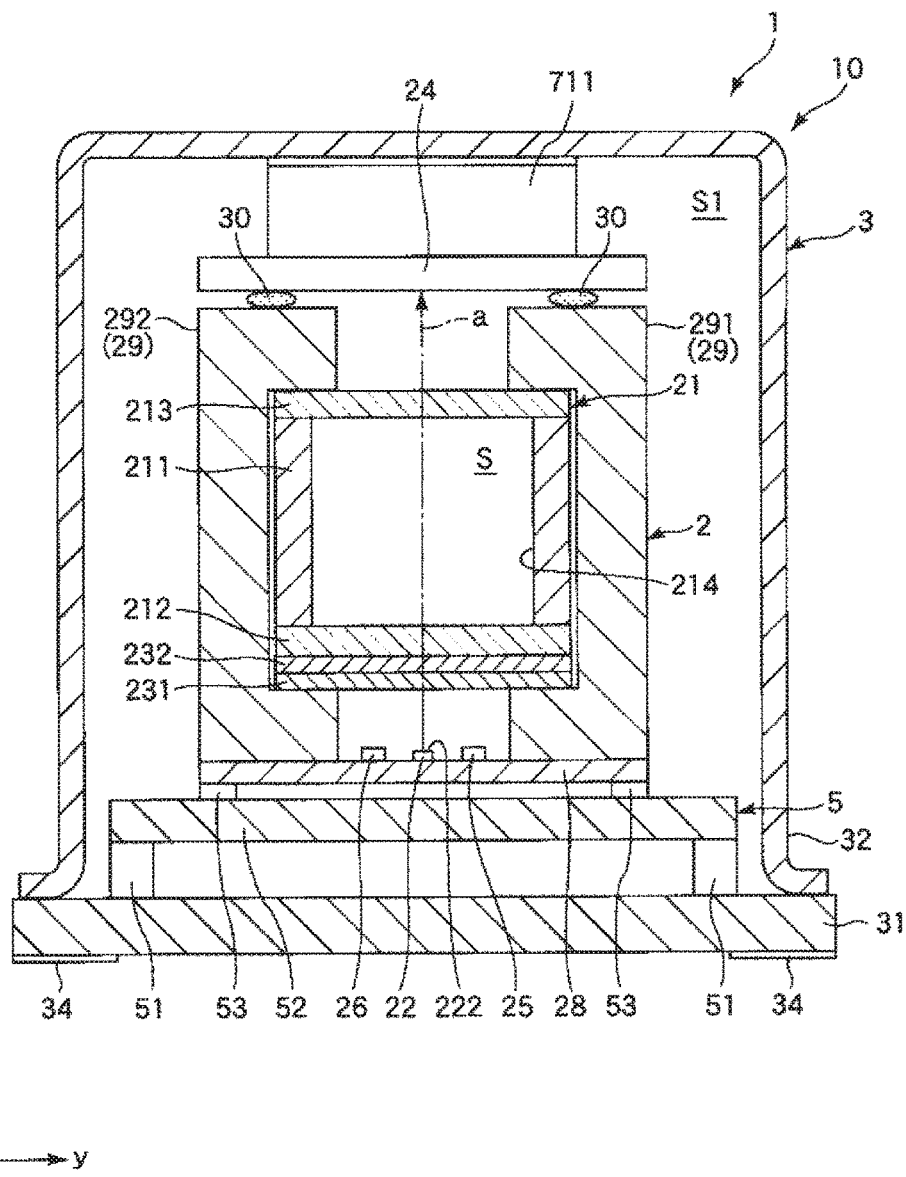
FIG. 3 is a sectional view of the atomic oscillator of FIG. 2 taken along the line A-A.
Figure 4:
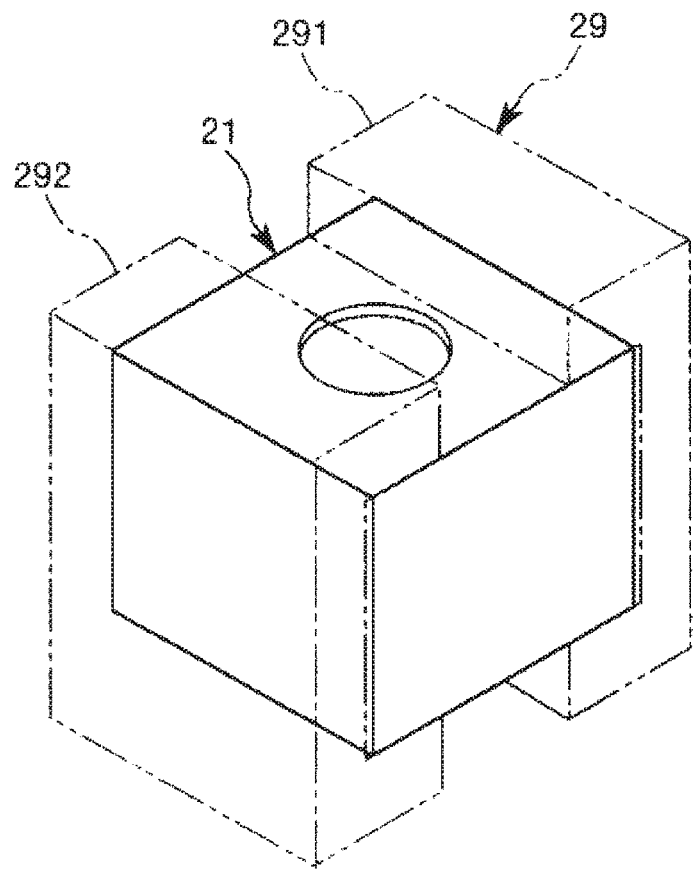
FIG. 4 is a schematic of the atomic cell and a connection member.

FIG. 2 is a sectional view showing the schematic configuration of the atomic oscillator. FIG. 3 is a sectional view taken along line A-A of FIG. 2. FIG. 4 is a diagram illustrating the atomic cell and a connection member.

In FIGS. 2 to 4, for convenience of description, the x axis, they axis, and the z axis which are three axes orthogonal to one another are shown by arrows. A tip side of each arrow is defined as "+ (plus)", and a base side of each arrow is defined as "− (minus)". Hereinafter, a direction parallel to the x axis is referred to as "x-axis direction", a direction parallel to the y axis is referred to as a "y-axis direction", and a direction parallel to the z axis is referred to as a "z-axis direction". Hereinafter, for convenience of description, the top side of FIGS. 2 and 3 is referred to as "top" and the bottom side is referred to as "bottom".

As shown in FIGS. 2 and 3, the atomic oscillator 1 is provided with an atomic cell unit 2 which causes the above-described coherent population trapping, a package 3 which houses the atomic cell unit 2, a support member 5 which is housed inside the package 3 and supports the atomic cell unit 2 with respect to the package 3, and reflective portions 711 and 712 which are provided on the inner surface of the package 3. A magnetic shield may be provided outside the package 3 as necessary. Hereinafter, the respective units of the package unit 10 will be described sequentially.

Atomic Cell Unit

The atomic cell unit 2 includes the atomic cell 21, the light source 22, the optical components 231 and 232, the light detection unit 24, the heater 25, the temperature sensor 26, a substrate 28 as a support portion, and a connection member 29, and these are formed into a unit. Specifically, the light source 22, the heater 25, the temperature sensor 26, and the connection member 29 are mounted on the top surface (one surface) of the substrate 28. The atomic cell 21 and the optical components 231 and 232 are retained by the connection member 29, and the light detection unit 24 is bonded to the connection member 29 through an adhesive 30.

Atomic Cell

As shown in FIGS. 2 and 3, the atomic cell 21 has a body portion 211 having a columnar through hole 214, and a pair of light transmissive portions 212 and 213 which seals the openings on both sides of the through hole 214. With this, an internal space S which is filled with alkali metal, such as gaseous rubidium, cesium, or sodium, is formed. The internal space S may be filled with noble gas, such as argon or neon, or inert gas, such as nitrogen, as buffer gas along with alkali metal gas as necessary. The shape of a cross-section of the through hole 214 in a direction perpendicular to the optical axis (a), or in other words, a cross-section of the internal space S is not particularly limited, and may be, for example, a circular shape, an elliptical shape, a polygonal shape, such as a quadrangular shape, or the like.

Each of the light transmissive portions 212 and 213 of the atomic cell 21 has transmissivity and therefore transmit the light LL from the light source 22. One light transmissive portion 212 is an "incidence-side light transmissive portion" which transmits the light LL incident in the atomic cell 21, and the other light transmissive portion 213 is an "emission-side light transmissive portion" which transmits the light LL emitted from the atomic cell 21.

A material forming the light transmissive portions 212 and 213 is not particularly limited as long as the material has transmissivity as described above. For example, a glass material, quartz, or the like may be used. A material forming the body portion 211 is not particularly limited, and may be a silicon material, a ceramics material, a metal material, a resin material, or the like, or may be a glass material, quartz, or the like the light transmissive portions 212 and 213.

Each of the light transmissive portions 212 and 213 is bonded to the body portion 211 hermetically. With this, the internal space S of the atomic cell 21 can be formed as an airtight space. A method of bonding the body portion 211 of the atomic cell 21 and the light transmissive portions 212 and 213 is determined according to the materials forming these portions and is not particularly limited. For example, a bonding method using an adhesive, a direct bonding method, an anode bonding method, or the like can be used.

Light Source

The light source 22 emits the light LL exciting the alkali metal atoms in the atomic cell 21. The light source 22 is supported by the substrate 28 such that a light emitting portion 222 which emits the light LL turns toward the atomic cell 21 side.

The light source 22 emits the light LL capable of exciting the alkali metal atoms in the atomic cell 21. The light source 22 is not particularly limited as long as the light source 22 can emit the light LL including the resonant light pair described above. For example, a light emitting element including a semiconductor laser, such as a vertical cavity surface emitting laser (VCSEL), may be used.

Optical Component

A plurality of optical components 231 and 232 are respectively provided on the optical path of the light LL between the light source 22 and the atomic cell 21 described above. In this embodiment, the optical component 231 and the optical component 232 are arranged in this order from the light source 22 side toward the atomic cell 21 side.

The optical component 231 is a neutral density filter (ND filter). With this, it is possible to regulate (decrease) the intensity of the light LL incident in the atomic cell 21. For this reason, even in a case where the output of the light source 22 is large, it is possible to make the light LL incident in the atomic cell 21 have a desired light amount.

The optical component 232 is a quarter-wave plate. With this, it is possible to convert the light LL from the light source 22 from linearly polarized light to circularly polarized light (right-handed circularly polarized light or left-handed circularly polarized light). With the use of the light LL which is circularly polarized light, it is possible to increase the number of atoms exhibiting a desired EIT phenomenon and to increase the intensity of a desired EIT signal. As a result, it is possible to improve the oscillation characteristics of the atomic oscillator 1.

In this embodiment, other light optical components, such as a lens and a polarizing plate, may be provided between the light source 22 and the atomic cell 21, in addition to the wave plate and the neutral density filter. The optical component 231 can be omitted according to the intensity of the excitation light from the light source 22. The arrangement order of the optical components 231 and 232 is not limited to the above-described example, and is arbitrarily determined.

Light Detector

The light detection unit 24 (i.e., alight detector) detects the intensity of the light LL transmitted through the atomic cell 21. The light detection unit 24 is bonded to the connection member 29 using the adhesive or the like.

The light detection unit 24 is not particularly limited as long as the light detection unit 24 can detect the light LL described above. For example, a solar cell or a photodetector (light receiving element), such as a photodiode, can be used.

Heater

The heater 25 has a heating resistor (heating portion) which generates heat with electrical conduction. The heater 25 is a "temperature regulator unit" or "temperature regulator element" which regulates the temperature of the atomic cell 21. With this, it is possible to maintain the atomic cell unit 2 at a desired temperature and to make the characteristics of the atomic oscillator 1 excellent.

In this embodiment, as described above, the heater 25 is provided on the substrate 28. Then, heat from the heater 25 is transmitted to the atomic cell 21 through the substrate 28 and the connection member 29. With this, the atomic cell 21 (specifically, the alkali metal in the atomic cell 21) is heated, and the alkali metal in the atomic cell 21 can be maintained in a gas stage having a desired concentration.

In this embodiment, heat from the heater 25 is also transmitted to the light source 22 through the substrate 28. With this, it is possible to perform temperature control of the light source 22 with high accuracy.

The heater 25 is separated from the atomic cell 21. With this, it is possible to prevent an unnecessary magnetic field, which is generated with electrical conduction to the heater 25, from affecting the metal atoms in the atomic cell 21.

Temperature Sensor

The temperature sensor 26 detects the temperature of the light source 22, the heater 25, or the atomic cell 21. Then, the amount of heat generated from the above-described heater 25 is suppressed based on the detection result of the temperature sensor 26. With this, it is possible to maintain the alkali metal atoms in the atomic cell 21 at a desired temperature.

In this embodiment, the temperature sensor 26 is provided on the substrate 28. Accordingly, the temperature sensor 26 detects the temperature of the light source 22 or the heater 25 through the substrate 28. Alternatively, the temperature sensor 26 detects the temperature of the atomic cell 21 through the substrate 28 and the connection member 29.

The position where the temperature sensor 26 is provided is not limited thereto, and may be, for example, on the connection member 29, on the heater 25, or on the outer surface of the atomic cell 21.

The temperature sensor 26 is not particularly limited, and various known temperature sensors, such as a thermistor and a thermocouple, can be used.

Coil

The coil 27 shown in FIG. 1 applies a magnetic field to the alkali metal in the atomic cell 21. With this, the degenerated gap between a plurality of different energy levels of the alkali metal atoms in the atomic cell 21 can be expanded by Zeeman splitting, thereby improving resolution. As a result, it is possible to increase the accuracy of the oscillation frequency of the atomic oscillator 1.

In this embodiment, the coil 27 is formed as a solenoid type with a coil wound around the outer circumference of the atomic cell 21. The coil 27 may be formed as a Helmholtz type with a pair of coils provided to face each other through the atomic cell 21.

The magnetic field generated by the coil 27 may be any one magnetic field of a DC magnetic field and an AC magnetic field, or may be a magnetic field in which a DC magnetic field and an AC magnetic field are superimposed on each other.

Connection Member

As shown in FIG. 4, the connection member 29 is formed with a pair of connection members 291 and 292 provided to sandwich the atomic cell 21 therebetween. As shown in FIG. 3, the connection members 291 and 292 are in contact with the light transmissive portions 212 and 213, respectively. The connection members 291 and 292 are formed so as to avoid a region through which the light LL passes. The shape of the connection members 291 and 292 is not limited to that shown in the drawing as long as the connection members 291 and 292 can fix the relative positional relationship of at least the atomic cell 21, the light source 22, and the light detection unit 24. The connection members 291 and 292 may be formed integrally, or the connection members 291 and 292 may be formed with a plurality of members.

In this way, the connection member 29 thermally connects the heater 25 and the light transmissive portions 212 and 213. Specifically, heat from the heater 25 can be transmitted to the light transmissive portions 212 and 213 with thermal conduction through the connection members 291 and 292, and the light transmissive portions 212 and 213 can be heated. The heater 25 can be separated from the atomic cell 21. For this reason, it is possible to prevent an unnecessary magnetic field generated with electrical conduction to the heater 25 from affecting the alkali metal atoms in the atomic cell 21. Furthermore, since it is possible to reduce the number of heaters 25, it is possible to reduce, for example, the number of wirings for electrical conduction to the heater 25, and as a result, to achieve reduction in size of the atomic oscillator 1.

As a material forming the connection member 29, a material having excellent thermal conductivity, for example, a metal material is preferably used. Furthermore, as the material forming the connection member 29, a nonmagnetic material is preferably used so as not to obstruct the magnetic field from the coil 27.

Substrate

As shown in FIGS. 2 and 3, the substrate 28 supports the light source 22, the heater 25, the temperature sensor 26, the connection member 29, and the like described above.

The substrate 28 thermally connects the heater 25 and the connection member 29, and transmits heat from the heater 25 to the connection member 29. With this, even if the heater 25 is separated from the connection member 29, it is possible to transmit heat from the heater 25 to the connection member 29. Furthermore, the light source 22 is mounted on the substrate 28, whereby it is possible to transmit heat from the heater 25 to the light source 22 through the substrate 28, and to perform the temperature control of the light source 22 with high accuracy.

The substrate 28 has wirings (not shown) which are electrically connected to the light source 22, the heater 25, and the temperature sensor 26. The wirings are electrically connected to a plurality of internal terminals (not shown) provided on the top surface of the base 31.

A material for forming the substrate 28 is not particularly limited, and for example, a ceramic material, a metal material, or the like is exemplified. One kind of these materials may be used alone or two kinds or more may be used in combination. In a case where the substrate 28 is formed of a metal material, an insulating layer formed of, for example, a resin material, metal oxide, metal nitride, or the like may be provided on the surface of the substrate 28 as necessary for the purpose of preventing short-circuiting of the wirings in the substrate 28.

Like the package 3 described below, as the material forming the substrate 28, a nonmagnetic material is preferably used so as not to obstruct the magnetic field from the coil 27.

The substrate 28 can be omitted depending on the shape of the connection member 29, the installation position of the heater 25, or the like. In this case, the heater 25 may be provided at a position in contact with the connection member 29.

Package

As shown in FIGS. 2 and 3, the package 3 houses the atomic cell unit 2 and the support member 5. In the package 3, components other than the above-described components may be housed.

The package 3 is provided with a plate-shaped base 31 (base portion) and a cylindrical lid 32 (lid portion) with a closed bottom, and the opening of the lid 32 is sealed with the base 31. With this, an internal space S1 which houses the atomic cell unit 2 and the support member 5 is formed. The lid 32 is separated from the atomic cell unit 2 and the support member 5. That is, a space is provided between the lid 32, and the atomic cell unit 2 and the support member 5. With this, the space forms a heat insulating layer, thereby reducing heat interference between the atomic cell unit 2 and the package 3.

The base 31 supports the atomic cell unit 2 through the support member 5.

The base 31 is, for example, a wiring board, and a plurality of terminals 34 are provided on the bottom surface of the base 31. A plurality of terminals 34 are electrically connected to a plurality of internal terminals (not shown) provided on the top surface of the base 31 through wirings (not shown).

A material forming the base 31 is not particularly limited. For example, a resin material, a ceramic material, or the like can be used. Of these, a ceramic material is preferably used. With this, it is possible to make airtightness of the internal space S1 excellent while realizing the base 31 forming a wiring board.

The lid 32 is bonded to the base 31. A method of bonding the base 31 and the lid 32 is not particularly limited, and for example, soldering, seam welding, energy beam welding (laser welding, electron beam welding, or the like), or the like can be used. A bonding member for bonding the base 31 and the lid 32 may be interposed between the base 31 and the lid 32.

The base 31 and the lid 32 are bonded to each other hermetically. That is, the internal space S1 is an airtight space, and is reduced in pressure lower than atmospheric pressure. In particular, in this embodiment, the internal space S1 is a vacuum. With this, it is possible to reduce change in temperature of the atomic cell unit 2, in particular, the light source 22 due to convection in the internal space S1. Furthermore, it is possible to reduce power consumption of the heater 25.

A material forming the lid 32 is not particularly limited, and for example, a resin material, a ceramic material, or the like can be used.

Support Member

The support member 5 is housed inside the package 3, and supports the atomic cell unit 2 with respect to the base 31 of the package 3.

The support member 5 suppresses transmission of heat between the atomic cell unit 2 and the package 3. With this, it is possible to reduce heat transmission between the respective units of the atomic cell unit 2, in particular, between the atomic cell 21 or the light source 22 and the package 3, and to suppress heat interference between the atomic cell 21 or the light source 22 and the outside of the package 3. For this reason, it is possible to perform the temperature control of the atomic cell 21, the light source 22, or the like with high accuracy.

As shown in FIG. 3, the support member 5 has a plurality of leg portions 51 which stand on the top surface side of the base 31, a plate-shaped connection portion 52 which is connected to top end portions of a plurality of leg portions 51 and has a plurality of holes passing therethrough in a thickness direction, and a plurality of columnar portions 53 which stand on the top surface side of the connection portion 52 and are connected to the substrate 28.

In the support member 5 configured as above, heat from the atomic cell unit 2 is transmitted to the base 31 through the columnar portions 53, the connection portion 52, and the leg portions 51 in this order. With this, it is possible to extend a transmission path of heat from the atomic cell unit 2 to the base 31 through the support member 5. For this reason, it is possible to further reduce transmission of heat between the atomic cell unit 2, in particular, the atomic cell 21 or the light source 22 and the package 3.

A material forming the support member 5 is not particularly limited as long as the material has comparatively low thermal conductivity and can secure rigidity of the support member 5 to support the atomic cell unit 2. For example, nonmetal, such as a resin material or a ceramic material, is preferably used, and a resin material is more preferably used. In a case where the support member 5 is primarily formed of a resin material, it is possible to increase heat resistance of the support member 5, and to easily manufacture the support member 5 using, for example, known methods, such as injection molding, even if the shape of the support member 5 is complicated. In particular, in a case where the support member 5 is primarily formed of a resin material, it is possible to easily form the support member 5 formed of a foam having large heat resistance.

As the material forming the support member 5, a nonmagnetic material is preferably used so as not to obstruct a magnetic field from the coil 27.

In this way, the support member 5 is provided between the atomic cell unit 2 and the package 3, and collectively supports the atomic cell 21 and the light source 22 with respect to the base 31 of the package 3. For this reason, it is possible to reduce heat transmission between the atomic cell 21 or the light source 22 and the package 3. Then, the thermal conductivity of the support member 5 from the light source 22 side to the package 3 side is preferably equal to or greater than $0.1 \text{ W·m}^{-1}\text{·K}^{-1}$ and equal to or less than $40.0 \text{ W·m}^{-1}\text{·K}^{-1}$, and more preferably, equal to or greater than $0.1 \text{ W·m}^{-1}\text{·K}^{-1}$ and equal to or less than $0.5 \text{ W·m}^{-1}\text{·K}^{-1}$. With this, it is possible to suppress heat transmission through the support member 5 between the atomic cell 21 or the light source 22 and the package 3, and to reduce change in temperature of the atomic cell 21 and the light source 22.

Reflective Portion

As shown in FIG. 2, the reflective portions 711 and 712 are film-like members provided on the inner surface of the lid 32. The reflective portions 711 and 712 have reflectance to an electromagnetic wave having a wavelength of 4 µm. That is, the reflective portions 711 and 712 have reflectance (hereinafter, referred to as "heat reflectance") to a far infrared ray equal to or greater than 50%, and can reflect radiant heat of the light source 22. For this reason, it is possible to suppress transmission of heat due to radiation between the package 3 and the light source 22, and to suppress change in temperature of the light source 22.

As shown in FIGS. 2 and 3, the reflective portion 711 is provided on a portion of the inner surface of the lid 32 along the −x axis side. As shown in FIG. 2, the reflective portion 712 is provided on a portion of the inner surface of the lid 32 along the +x axis side.

In this way, the reflective portions 711 and 712 are provided on the inner surface of the lid 32 visible from the light source 22. In this embodiment, as described above, the connection members 291 and 292 are provided to sandwich the atomic cell 21 therebetween. The connection member 291 is provided on the +y axis side, and the connection member 292 is provided on the −y axis side. For this reason, the connection member 29 is provided between the light source 22 and the lid 32 in the y-axis direction, whereas the connection member 29 is not provided between the light source 22 and the lid 32 in the x-axis direction. In this way, the reflective portions 711 and 712 are provided on the inner surface of the lid 32 so as to correspond to locations where there is no component of the atomic cell unit 2 which shields the space between the light source 22 and the package 3.

The reflective portions 711 and 712 are provided on the +z axis side from the light source 22. That is, the reflective portions 711 and 712 are provided on a side of the light source 22 from which light is emitted.

As described above, although the reflectance of heat of the reflective portions 711 and 712 is described as being equal to or greater than 50%, the higher the reflectance of heat, the higher the effect to reflect radiant heat of the light source 22 becomes. For this reason, the reflectance of heat of the reflective portions 711 and 712 is preferably equal to or greater than 75%, more preferably, equal to or greater than 90%, and still more preferably, equal to or greater than 95%.

A material forming the reflective portions 711 and 712 is not particularly limited as long as the reflectance of heat is equal to or greater than 50%, and a metal material is preferably used. With this, it is possible to make the reflectance of heat of the reflective portions 711 and 712 high, such as equal to or greater than 75%, and to suitably reflect radiant heat of the light source 22 by the reflective portions 711 and 712.

In a case of forming the reflective portions 711 and 712 of a metal material, the metal material is not particularly limited, and can be, for example, metal, such as copper (reflectance of heat is 97.93%), silver (reflectance of heat is 98.47%), gold (reflectance of heat is 98.62%), titanium (reflectance of heat is 78.04%), chromium (reflectance of heat is 93.77%), iron (reflectance of heat is 87.09%), cobalt (reflectance of heat is 87.75%), nickel (reflectance of heat is 92.38%), aluminum (reflectance of heat is 99.03%), iridium (reflectance of heat is 98.73%), or lead (reflectance of heat is 98.90%), or an alloy containing at least one kind thereof. Of these, from the viewpoint of high reflectance of heat, copper, silver, gold, chromium, nickel, aluminum, iridium, or lead is preferably used. In addition, from the viewpoint of excellent chemical stability, gold is preferably used.

In a case of forming the reflective portions 711 and 712 of a metal material, the reflective portions 711 and 712 may be formed of one kind of metal or an alloy thereof or may be formed by laminating two or more kinds of metal or alloys thereof. A method of forming the reflective portions 711 and 712 is not particularly limited, and can include, for example, a vapor film deposition method, such as vapor deposition or sputtering, or bonding a metal film prepared separately. With this, it is possible to obtain the homogeneous reflective portions 711 and 712 with reduced unevenness of reflectance.

The configuration of the package unit 10 has been described above.

The atomic oscillator 1 which is a kind of a quantum interference device described above has the atomic cell 21 which is filled with the alkali metal atoms, the light source 22 which emits the light LL exciting the alkali metal atoms in the atomic cell 21, the light detection unit 24 which detects the light LL transmitted through the atomic cell 21, the package 3 which has the internal space S1 housing at least the light source 22, and the reflective portions 711 and 712. The reflective portions 711 and 712 are provided between the inner surface of the package 3 and the light source 22, and have reflectance to an electromagnetic wave having a wavelength of 4 µm equal to or greater than 50%. According to the atomic oscillator 1, it is possible to suppress transmission of heat due to radiation between the package 3 and the light source 22. For this reason, it is possible to suppress or minimize change in temperature of the light source 22, and as a result, to suppress or minimize fluctuation of the wavelength of the light LL emitted from the light source 22.

As described above, the reflective portions 711 and 712 are provided on the inner surface of the package 3. The reflective portions 711 and 712 are provided on the inner surface of the package 3 using, for example, the above-described forming method, whereby it is possible to easily and reliably form the reflective portions 711 and 712 with satisfactory reflection efficiency. With this, it is possible to efficiently reflect radiant heat of the light source 22 with the reflective portions 711 and 712, and to reduce escape of radiant heat of the light source 22 to the package 3. For this reason, it is possible to effectively suppress change in temperature of the light source 22.

As described above, the reflective portions 711 and 712 are provided on the side of the light source 22 from which the light LL is emitted. The portion of the light source 22 that emits the light LL or, in other words, the light emitting portion 222 is particularly likely to be affected by a change in temperature. For this reason, the reflective portions 711 and 712 are provided on the side of the light source 22 from which the light LL is emitted, whereby it is possible to more remarkably exhibit the effect to suppress change in temperature of the light source 22. As a result, it is possible to more effectively suppress fluctuation of the wavelength of the light LL emitted from the light source 22.

As described above, the reflective portions 711 and 712 are provided at the locations where there is no component of the atomic cell unit 2 which shields the space between the light source 22 and the package 3. With this, it is possible to more effectively reduce escape of heat of the light source 22 to the package 3. For this reason, it is possible to effectively suppress change in temperature of the light source 22.

In the atomic oscillator 1, as described above, the internal space S1 is brought into a state of being reduced in pressure lower than atmospheric pressure, whereby change in temperature of the light source 22 due to convection in the internal space S1 is reduced. In addition, in the atomic oscillator 1, the atomic cell unit 2 is supported with respect to the package 3 by the support member 5, whereby heat transmission between the light source 22 and the package 3 is reduced and change in temperature of the light source 22 is reduced. Then, in the atomic oscillator 1, the reflective portions 711 and 712 are provided, whereby transmission of heat due to radiation between the package 3 and the light source 22 is suppressed and change in temperature of the light source 22 is reduced. From this, according to the atomic oscillator 1, it is possible to remarkably exhibit the effect to suppress fluctuation of the wavelength of the light LL emitted from the light source 22.

Second Embodiment

Next, a second embodiment of the present disclosure will be described.

Figure 5:
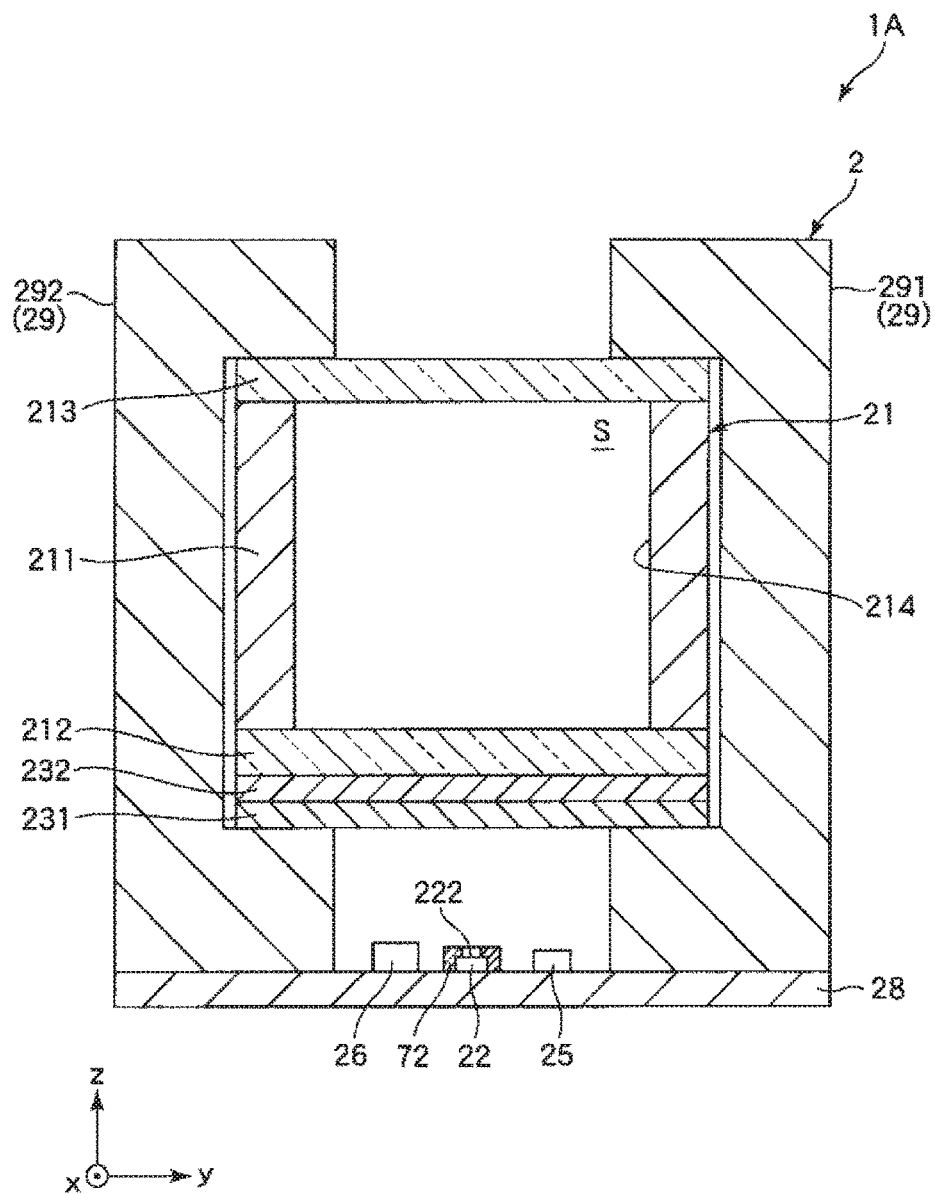
FIG. 5 is a schematic of a sectional view of an atomic cell unit of an atomic oscillator provided with a quantum interference device according to a second embodiment of the present disclosure.

FIG. 5 is a schematic sectional view showing an atomic cell unit of an atomic oscillator provided with a quantum interference device according to the second embodiment of the present disclosure.

The atomic oscillator of this embodiment is the same as in the above-described first embodiment, except that the configuration of a reflective portion is different.

In the following description, the second embodiment will be described focusing on differences from the above-described embodiment, and description of the same matters will not be repeated. In FIG. 5, the same configurations as those in the above-described embodiment are represented by the same reference numerals.

As shown in FIG. 5, an atomic oscillator 1A of this embodiment has a reflective portion 72 which is provided on the outer surface of the light source 22. In this embodiment, the reflective portion 72 is provided on the outer surface of the light source 22, such as the side surface or the top surface, excluding the surface of the light source 22 in contact with the substrate 28 and the light emitting portion 222. That is, the reflective portion 72 is provided so as to cover the outer surface of the light source 22 and so as not to obstruct the light LL emitted from the light emitting portion 222, whereby it is possible to effectively reduce transmission of radiant heat from the light source 22 to the package 3.

As in this embodiment, in a case where the reflective portion 72 is provided on the outer surface of the light source 22, in order to prevent short-circuiting of the wirings (not shown) provided on the light source 22, an insulating film, such as a silicon oxide film or a silicon nitride film, may be provided between the light source 22 and the reflective portion 72.

Even with the atomic oscillator 1A, it is possible to suppress change in temperature of the light source 22, and to suppress fluctuation of the wavelength of the light LL emitted from the light source 22.

Third Embodiment

Next, a third embodiment of the present disclosure will be described.

Figure 6:
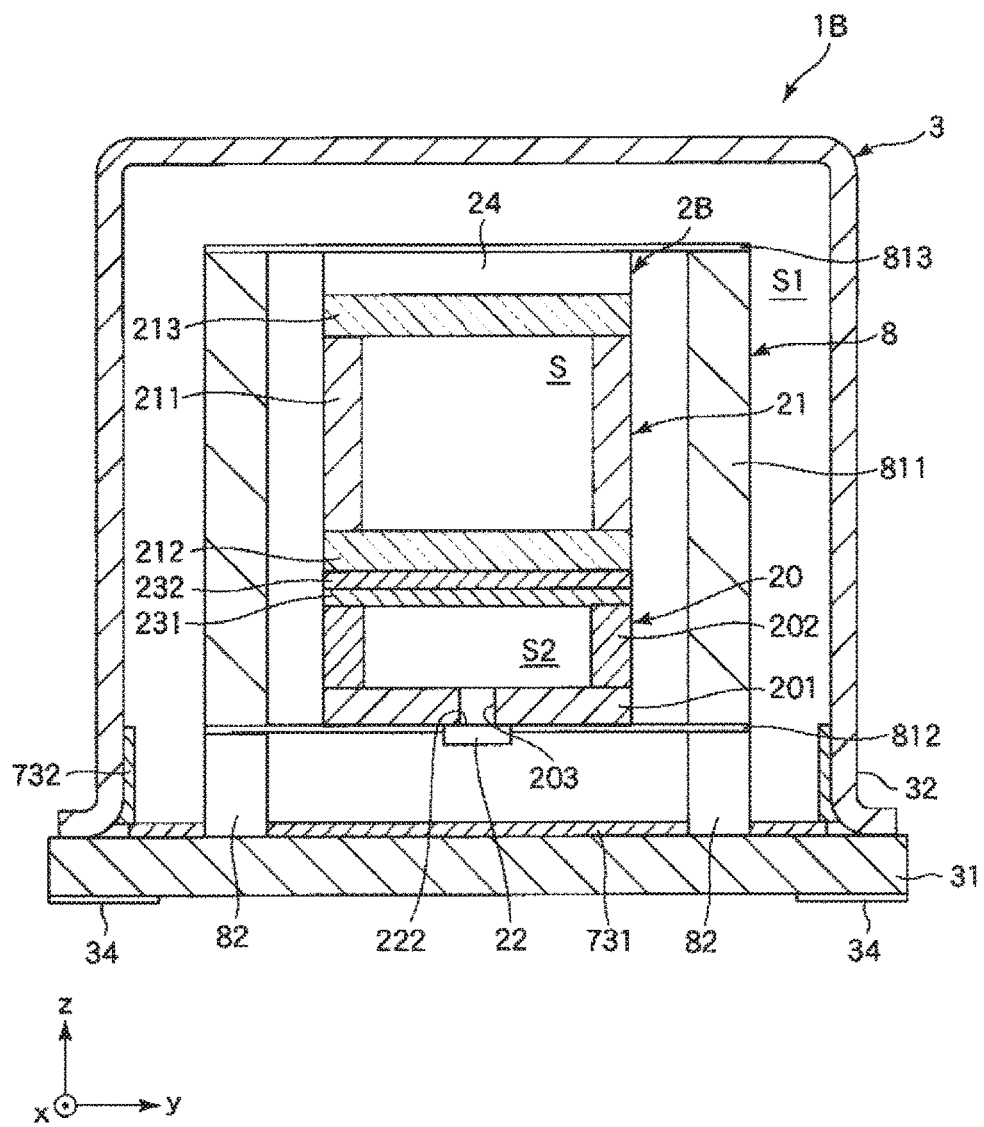
FIG. 6 is a schematic of a sectional view of an atomic oscillator provided with a quantum interference device according to a third embodiment of the present disclosure.

FIG. 6 is a sectional view showing the schematic configuration of an atomic oscillator provided with a quantum interference device according to the third embodiment of the present disclosure.

The atomic oscillator of this embodiment is the same as in the above-described first embodiment, except that the configurations of an atomic cell unit, a support member, and reflective portions are different.

In the following description, the third embodiment will be described focusing on differences from the above-described embodiment, and description of the same matters will not be repeated. In FIG. 6, the same configurations as those in the above-described embodiment are represented by the same reference numerals.

As shown in FIG. 6, an atomic oscillator 1B of this embodiment is provided with a package 3, an atomic cell unit 2B, a support member 8 which supports the atomic cell unit 2B with respect to the package 3, and reflective portions 731 and 732.

The atomic cell unit 2B includes an atomic cell 21, a light source 22, optical components 231 and 232, a light detection unit 24, and a spacer 20, and these are formed into a unit. Though not shown, a heater and a temperature sensor are provided at arbitrary locations of the atomic cell unit 2B, for example, on the spacer 20.

The spacer 20 has a substrate 201 as a support portion, and a frame portion 202 which stands on the outer circumferential portion of the substrate 201. In the top end portion of the frame portion 202, the optical components 231 and 232 are provided. In this way, the top of the spacer 20 is closed by the optical components 231 and 232, whereby a space S2 is formed inside the substrate 201 and the frame portion 202. The atomic cell 21 is connected onto the optical component 232, and the light detection unit 24 is connected to the top surface of the atomic cell 21 through an adhesive (not shown).

The substrate 201 has a hole 203 passing therethrough in a thickness direction in the center portion. On the bottom surface of the substrate 201, the light source 22 is provided so as to close the lower opening of the hole 203. The light source 22 is attached to the substrate 201 such that the light emitting portion 222 turns toward the substrate 201 side. With this, the light LL is emitted toward the atomic cell 21 through the hole 203.

The substrate 201 has wirings (not shown) which are electrically connected to the light source 22.

The support member 8 has a frame body 811, two sheet members 812 and 813, and leg portions 82. The support member 8 supports the above-described atomic cell unit 2B with respect to the base 31 of the package 3. Furthermore, the support member 8 reduces heat transmission between the atomic cell unit 2B and the package 3. With this, it is possible to perform the temperature control of the atomic cell 21, the light source 22, or the like with high accuracy.

The frame body 811 is provided to be separated from the atomic cell unit 2B when viewed from the Z-axis direction, and surrounds the outer circumference of the atomic cell unit 2B. A material forming the frame body 811 is not particularly limited as long as the material has comparatively low thermal conductivity, and for example, non-metal, such as a resin material or a ceramic material, is preferably used, and a resin material is more preferably used. In a case where the frame body 811 is primarily formed of a resin material, it is possible to reduce thermal conductivity of the frame body 811, and even if the shape of the frame body 811 is complicated, it is possible to easily manufacture the frame body 811, for example, using a known method, such as injection molding.

The sheet members 812 and 813 are, for example, flexible wiring boards. The sheet member 812 has a center portion connected to the light source 22 and an outer circumferential portion connected to the bottom surface of the frame body 811. The sheet member 813 has a center portion connected to the light detection unit 24 and an outer circumferential portion connected to the top surface of the frame body 811. According to the sheet members 812 and 813, since heat resistance in the surface direction is high, it is possible to reduce thermal conduction between the frame body 811 and the atomic cell unit 2B.

The sheet member 812 has wirings (not shown) which are electrically connected to the light source 22, and the sheet member 813 has wirings (not shown) which are electrically connected to the light detection unit 24. The wirings are electrically connected to the internal terminals (not shown) of the package 3.

A plurality of leg portions 82 are connected to the bottom end portion of the frame body 811. A plurality of leg portions 82 support the frame body 811 with respect to the base 31. As a material forming a plurality of leg portions 82, the same material as the material forming the frame body 811 described above can be used. A plurality of leg portions 82 may be formed integrally with the frame body 811.

As shown in FIG. 6, the atomic oscillator 1B has a substrate 201 as a support portion which supports the light source 22, and reflective portions 731 and 732 are provided in portions of the inner surface of the package 3 visible from the light source 22. Specifically, the reflective portion 731 is provided on the top surface of the base 31. The reflective portion 732 is provided on the bottom side of the inner surface of the lid 32, and is provided on the −z axis side from the light source 22. In this way, the reflective portions 731 and 732 are provided on the light source 22 side with respect to the substrate 201 as a support portion which supports the light source 22. With this, it is possible to effectively reduce transmission of heat due to radiation between the package 3 and the light source 22.

Even with the atomic oscillator 1B, it is possible to suppress change in temperature of the light source 22, and to suppress fluctuation of the wavelength of the light LL emitted from the light source 22.

Fourth Embodiment

Next, a fourth embodiment of the present disclosure will be described.

Figure 7:
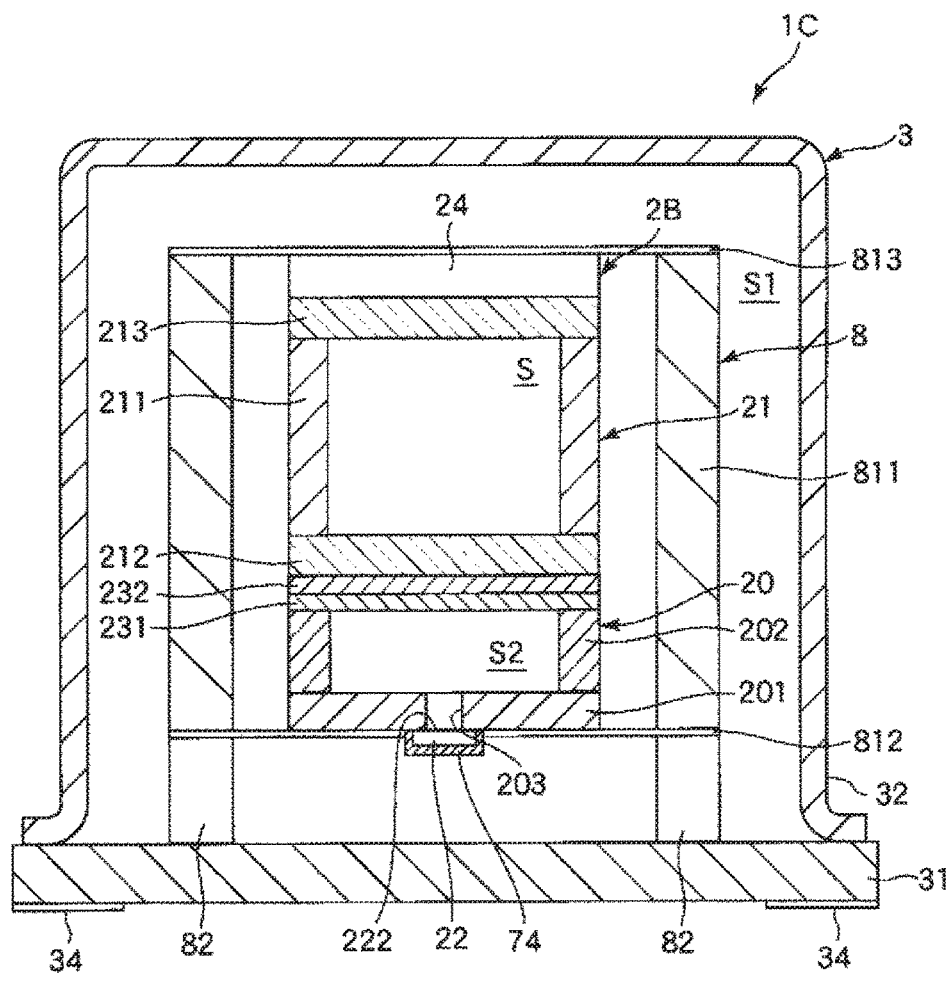
FIG. 7 is a schematic of a sectional view of an atomic oscillator provided with a quantum interference device according to a fourth embodiment of the present disclosure.

FIG. 7 is a sectional view showing the schematic configuration of an atomic oscillator provided with a quantum interference device according to the fourth embodiment of the present disclosure.

The atomic oscillator of this embodiment is the same as in the above-described third embodiment, except that the configuration of a reflective portion is different.

In the following description, the fourth embodiment will be described focusing on differences from the above-described embodiment, and description of the same matters will not be repeated. In FIG. 7, the same configurations as those in the above-described embodiment are represented by the same reference numerals.

As shown in FIG. 7, an atomic oscillator 1C of this embodiment has a reflective portion 74 which is provided on the outer surface of the light source 22. Specifically, the reflective portion 74 is provided on the outer surface of the light source 22 excluding the surface of the light source 22 in contact with the substrate 201 and the light emitting portion 222. That is, in this embodiment, as shown in the drawing, the reflective portion 74 is provided on the side surface and bottom surface of the light source 22. In this way, the reflective portion 74 is provided so as to cover the outer surface of the light source 22, whereby it is possible to effectively reduce transmission of radiant heat from the light source 22 to the package 3. The reflective portion 74 is provided on the light source 22 side with respect to the substrate 201 as a support portion which supports the light source 22, whereby it is possible to effectively transmission of heat due to radiation between the package 3 and the light source 22.

Even with the atomic oscillator 1C, it is possible to suppress change in temperature of the light source 22, and to suppress fluctuation of the wavelength of the light LL emitted from the light source 22.

Fifth Embodiment

Next, a fifth embodiment of the present disclosure will be described.

Figure 8:
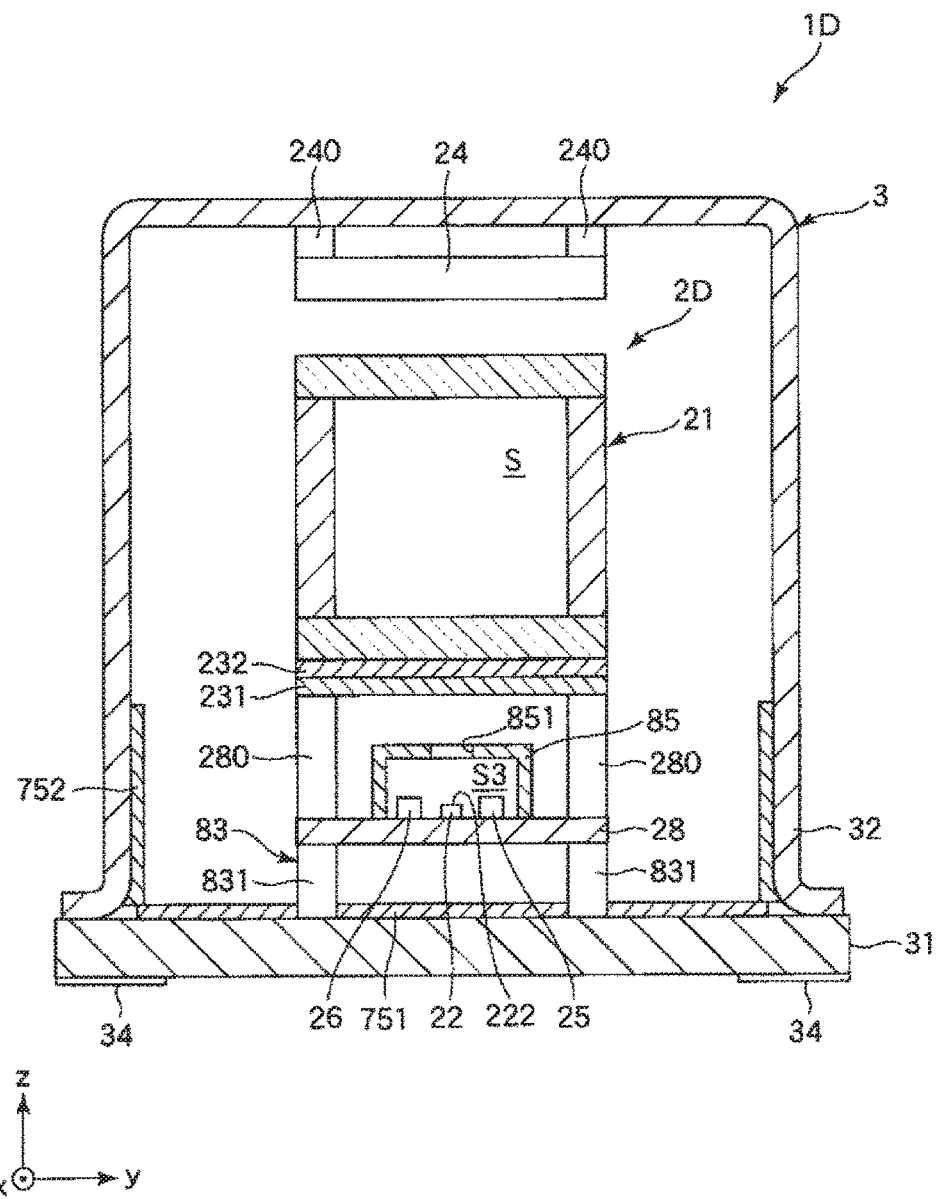
FIG. 8 is a schematic of a sectional view of an atomic oscillator provided with a quantum interference device according to a fifth embodiment of the present disclosure.

FIG. 8 is a sectional view showing the schematic configuration of an atomic oscillator provided with a quantum interference device according to the fifth embodiment of the present disclosure.

The atomic oscillator of this embodiment is the same as in the above-described first embodiment, except that the configurations of an atomic cell unit, a light detection unit, a support member, and reflective portions are different.

In the following description, the fifth embodiment will be described focusing on differences from the above-described embodiment, and description of the same matters will not be repeated. In FIG. 8, the same configurations as those in the above-described embodiment are represented by the same reference numerals.

As shown in FIG. 8, an atomic oscillator 1D of this embodiment is provided with an atomic cell unit 2D, a light detection unit 24, a package 3, and a support member 83. The atomic cell unit 2D includes an atomic cell 21, a light source 22, optical components 231 and 232, a heater 25, a temperature sensor 26, a isothermal cage 85, a substrate 28 as a support portion, and a plurality of columnar portions 280, and these are formed into a unit.

A plurality of columnar portions 280 of the atomic cell unit 2D respectively stand on the outer circumferential portion of the substrate 28, and the top end portions thereof are connected to the optical component 231.

The isothermal cage 85 shown in FIG. 8 has a box shape, and is provided on the substrate 28 so as to have a space S3 surrounding the light source 22, the heater 25, and the temperature sensor 26.

The isothermal cage 85 has an opening 851 opened upward. The light source 22 is provided inside the isothermal cage 85 such that the light LL passes through the opening 851. A member having light transmissivity may be provided in the opening 851.

The isothermal cage 85 configured as above is made at the same temperature as the heater 25. With this, it is possible to reduce the temperature difference between the light source 22 and the heater 25, and to perform the temperature control of the light source 22 with high accuracy.

A material forming the isothermal cage 85 is not particularly limited, and for example, a metal material is preferably used. With this, it is easy to make the isothermal cage 85 and the heater 25 at the same temperature, and therefore, it is possible to further reduce the temperature difference between the light source 22 and the heater 25.

When the width of the appearance of the isothermal cage 85 is W1 (not shown) and the width of the appearance of the heater 25 is W2 (not shown), W1/W2 is preferably equal to or greater than 2 and equal to or less than 10, and more preferably, equal to or greater than 4 and equal to or less than 8. When the height of the appearance of the isothermal cage 85 is T1 (not shown) and the height of the appearance of the heater 25 is T2 (not shown), T1/T2 is preferably equal to or greater than 2 and equal to or less than 10, and more preferably, equal to or greater than 4 and equal to or less than 8. With this, it is possible to further reduce the temperature difference of the isothermal cage 85, the light source 22, and the heater 25 while sufficiently securing the space for providing the light source 22, the heater 25, and the temperature sensor 26 inside the isothermal cage 85, and to consider the isothermal cage 85, the light source 22, and the heater 25 being thermally identical.

The light detection unit 24 is supported by the lid 32 of the package 3 through a plurality of connection members 240 having a columnar shape. The light detection unit 24 is electrically connected to the internal terminal (not shown) of the base 31 or the substrate 28 through a wiring (not shown).

The support member 83 has a plurality of leg portions 831. A plurality of leg portions 831 stand on the base 31, and the top end portions thereof are connected to the substrate 28. A plurality of leg portions 831 support the atomic cell unit 2D with respect to the base 31 of the package 3.

As shown in FIG. 8, reflective portions 751 and 752 are provided in portions of the inner surface of the package 3 visible from the isothermal cage 85. Specifically, the reflective portion 751 is provided on the top surface of the base 31. The reflective portion 752 is provided on the bottom side of the inner surface of the lid 32. Since it is possible to consider the isothermal cage 85 and the light source 22 being thermally identical, as described above, the reflective portions 751 and 752 are provided in the portions visible from the isothermal cage 85, whereby it is possible to reflect radiant heat of the isothermal cage 85. As a result, it is possible to more remarkably exhibit the effect to suppress change in temperature of the light source 22.

Even with the atomic oscillator 1D, it is possible to suppress change in temperature of the light source 22, and to suppress fluctuation of the wavelength of the light LL emitted from the light source 22.

2. Electronic Apparatus

The atomic oscillators 1, 1A, 1B, 1C, or 1D provided with the quantum interference device embodiment of the present disclosure described above can be incorporated in various electronic apparatuses.

Hereinafter, an example of an electronic apparatus which is provided with the atomic oscillator provided with the quantum interference device of the present disclosure will be described.

Figure 9:
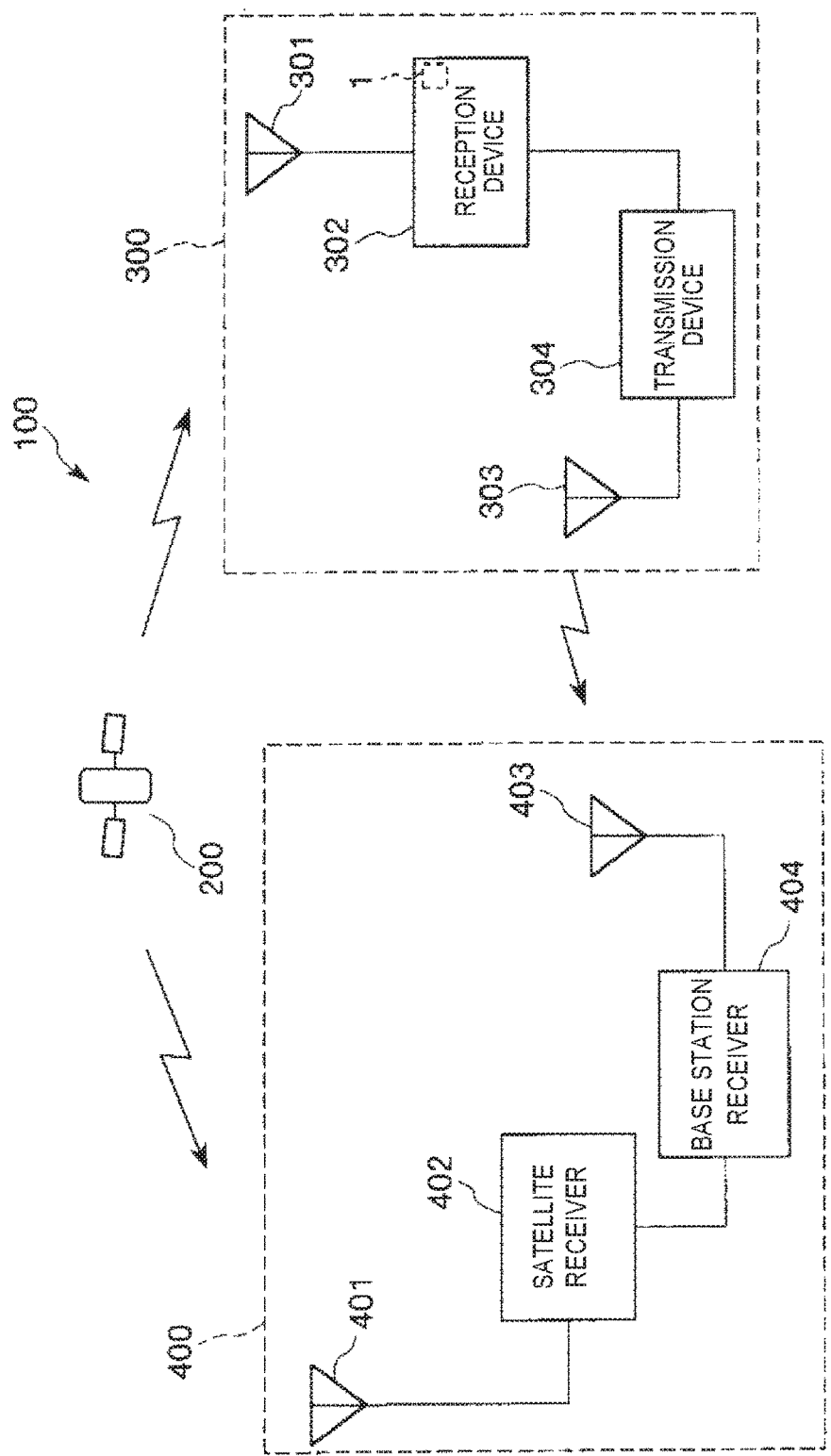
FIG. 9 is a schematic diagram of an atomic oscillator provided with the quantum interference device of the present disclosure in a positioning system using a GPS satellite.

FIG. 9 is a diagram showing a schematic configuration in a case where the atomic oscillator provided with the quantum interference device of the present disclosure is used in a positioning system using a GPS satellite.

A positioning system 100 shown in FIG. 9 includes a GPS satellite 200, a base station device 300, and a GPS reception device 400.

The GPS satellite 200 transmits positioning information (GPS signal).

The base station device 300 is provided with a reception device 302 which receives the positioning information from the GPS satellite 200 through an antenna 301 provided, for example, at an electronic reference point (GPS continuous observation station) with high accuracy, and a transmission device 304 which transmits the positioning information received by the reception device 302 through an antenna 303.

The reception device 302 is an electronic apparatus which is provided with the atomic oscillators 1, 1A, 1B, 1C, or 1D of the present disclosure as a reference frequency oscillation source. The reception device 302 has excellent reliability. The positioning information received by the reception device 302 is transmitted by the transmission device 304 in real time.

The GPS reception device 400 is provided with a satellite receiver 402 which receives the positioning information from the GPS satellite 200 through an antenna 401, and a base station receiver 404 which receives the positioning information from the base station device 300 through an antenna 403.

Since the reception device 302 which is an example of an electronic apparatus is provided with the atomic oscillators 1, 1A, 1B, 1C, or 1D which is a kind of the quantum interference device of the present disclosure, it is possible to exhibit excellent reliability.

The electronic apparatus of the present disclosure is not limited to that described above, and can be applied to, for example, a smartphone, a tablet terminal, a timepiece, a mobile phone, a digital still camera, an ink jet ejection apparatus (for example, an ink jet printer), a personal computer (a mobile personal computer or a laptop personal computer), a television, a video camera, a video tape recorder, a car navigation system, a pager, an electronic organizer (including one with a communication function), an electronic dictionary, an electronic calculator, an electronic game machine, a word processor, a work station, a video phone, a security television monitor, electronic binoculars, a POS terminal, medical equipment (for example, an electronic thermometer, a blood pressure monitor, a blood glucose monitor, an electrocardiographic apparatus, an ultrasound diagnostic apparatus, or an electronic endoscope), a fish-finder, a variety of measurement instrument, meters (for example, meters of a vehicle, an airplane, or a ship), a flight simulator, a terrestrial digital broadcasting system, a mobile phone base station, or the like.

3. Moving Object

The atomic oscillators 1, 1A, 1B, 1C, or 1D provided with the quantum interference device of the present disclosure described above can be incorporated in various moving objects.

Hereinafter, an example of a moving object according to an embodiment of the present disclosure will be described.

Figure 10:
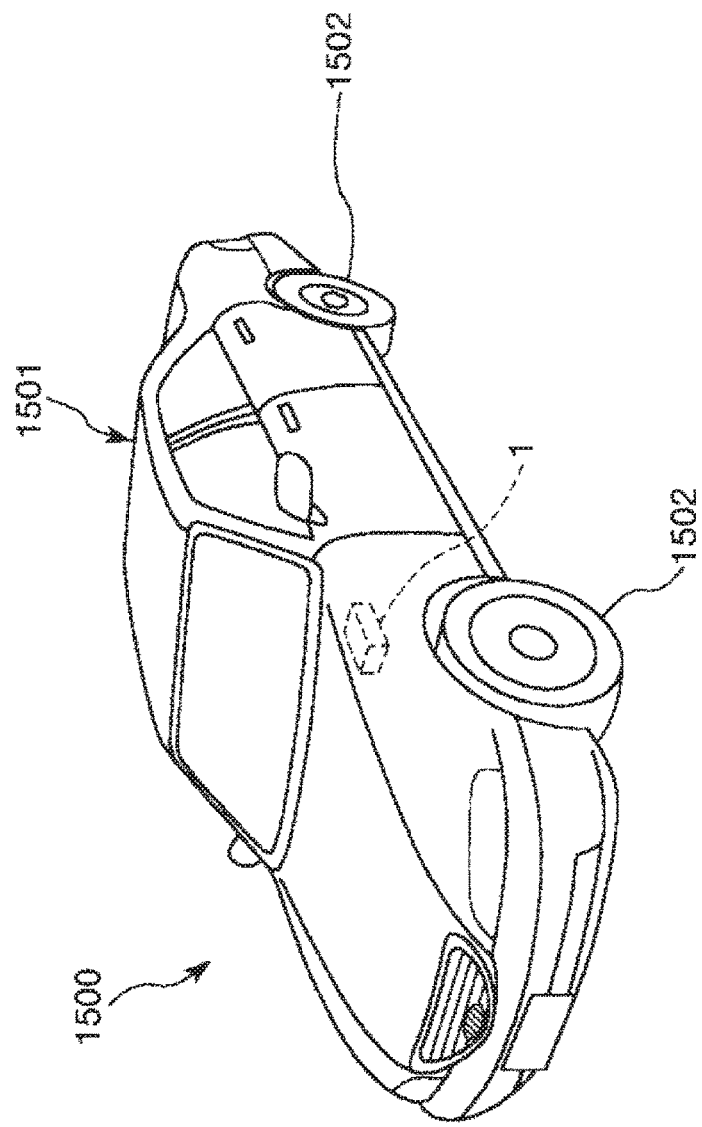
FIG. 10 is a schematic of a moving object (vehicle) having an atomic oscillator provided with the quantum interference device of the present disclosure.

FIG. 10 is a perspective view showing the configuration of a moving object (vehicle) which is provided with an atomic oscillator provided with the quantum interference device of the present disclosure.

A moving object 1500 shown in FIG. 10 has a vehicle body 1501 and four wheels 1502, and is configured such that the wheels 1502 are rotated by a power source (engine) (not shown) provided in the vehicle body 1501. The atomic oscillators 1, 1A, 1B, 1C, or 1D is embedded in the moving object 1500. Then, for example, a control unit (not shown) controls driving of the power source in response to an oscillation signal from the atomic oscillators 1, 1A, 1B, 1C, or 1D.

Since such a moving object is provided with the atomic oscillator 1, 1A, 1B, 1C, or 1D which is a kind of the quantum interference device of the present disclosure, it is possible to exhibit excellent reliability.

Although the quantum interference device, the atomic oscillator, the electronic apparatus, and the moving object of the present disclosure have been described based on the illustrated embodiments, the present disclosure is not limited thereto, and for example, the respective components of the foregoing embodiment may be replaced with arbitrary components having the same functions, or arbitrary components may be added.

In the above-described embodiments, although an example where the quantum interference device of the present disclosure is used to the atomic oscillator using the electromagnetically induced transparency (EIT) phenomenon has been described, the quantum interference device of the present disclosure is not limited thereto, and may be applied to, for example, an atomic oscillator using a double resonance method, an oscillator other than a quartz oscillator, or the like.

What is claimed is:

1. A quantum interference device comprising:
   an atomic cell that has alkali metal atoms disposed therewithin;
   a light source that emits light for exciting the alkali metal atoms in the atomic cell;
   a light detector that detects the light transmitted through the atomic cell;
   a package that defines an internal space and houses at least the light source; and
   a reflective portion provided between an inner surface of the package and the light source, and that has reflectance to an electromagnetic wave having a wavelength of 4 μm, wherein the reflectance of the reflective portion is greater than or equal to 50%,
   wherein the reflective portion is provided on an outer surface of the light source.

2. The quantum interference device according to claim 1, wherein the reflective portion is provided on a side of the light source from which the light is emitted.

3. The quantum interference device according to claim 1, further comprising:
   a support member that supports the light source,
   wherein the reflective portion is continuously provided on the support member.

4. The quantum interference device according to claim 1, wherein a pressure of the internal space is lower than atmospheric pressure.

5. The quantum interference device according to claim 1, further comprising:
   a support member that supports the atomic cell and the light source with respect to the package,
   wherein a thermal conductivity of the support member is equal to or greater than $0.1\ \text{W}\cdot\text{m}^{-1}\cdot\text{K}^{-1}$ and equal to or less than $40.0\ \text{W}\cdot\text{m}^{-1}\cdot\text{K}^{-1}$.

6. An atomic oscillator comprising:
   the quantum interference device according to claim 1.

7. An electronic apparatus comprising:
   the quantum interference device according to claim 1.

8. A moving object comprising:
   the quantum interference device according to claim 1.

* * * * *